US008008991B2

(12) United States Patent
Tcaciuc et al.

(10) Patent No.: US 8,008,991 B2
(45) Date of Patent: Aug. 30, 2011

(54) ELECTRICAL FILTER HAVING A DIELECTRIC SUBSTRATE WITH WIDE AND NARROW REGIONS FOR SUPPORTING CAPACITORS AND CONDUCTIVE WINDINGS

(75) Inventors: Alexander M. Tcaciuc, New Westminster (CA); Murray C. Thom, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 797 days.

(21) Appl. No.: 12/016,709

(22) Filed: Jan. 18, 2008

(65) Prior Publication Data

US 2008/0176751 A1 Jul. 24, 2008

Related U.S. Application Data

(60) Provisional application No. 60/881,358, filed on Jan. 18, 2007.

(51) Int. Cl.
*H03H 7/01* (2006.01)

(52) U.S. Cl. ........ 333/168; 333/175; 333/185; 333/99 S

(58) Field of Classification Search .................. 333/168, 333/175, 185, 181, 184, 99 S; 505/210
See application file for complete search history.

(56) References Cited

U.S. PATENT DOCUMENTS

| | | | | |
|---|---|---|---|---|
| 3,380,004 | A * | 4/1968 | Hansen | 333/184 |
| 4,453,144 | A * | 6/1984 | Tamura et al. | 333/140 |
| 5,616,539 | A | 4/1997 | Hey-Shipton et al. | 505/210 |
| 5,618,777 | A | 4/1997 | Hey-Shipton et al. | 505/210 |
| 5,831,489 | A | 11/1998 | Wire | 333/99 S |
| 5,937,263 | A | 8/1999 | Eisenmann et al. | 419/2 |
| 5,939,955 | A * | 8/1999 | Chen et al. | 333/185 |
| 6,347,237 | B1 | 2/2002 | Eden et al. | 505/210 |
| 6,686,811 | B2 | 2/2004 | Hey-Shipton | 333/99 S |
| 6,838,694 | B2 | 1/2005 | Esteve et al. | 257/34 |
| 6,898,450 | B2 | 5/2005 | Eden et al. | 505/210 |

(Continued)

FOREIGN PATENT DOCUMENTS

CA 2058837 7/1992

(Continued)

OTHER PUBLICATIONS

Berkley, "A Josephson Junction Qubit," Dissertation submitted to the Graduate School of the University of Maryland at College Park, pp. ii-195, 2003.

(Continued)

*Primary Examiner* — Benny Lee

(74) *Attorney, Agent, or Firm* — Seed IP Law Group PLLC

(57) ABSTRACT

An electrical filter includes a circuit board with an insulative substrate of alternating wide and narrow portions between input and output ends. Capacitors received in through-holes in the wide portions are electrically coupled to signal traces on a signal surface and ground traces on a ground surface of the circuit board. Conductive coils about narrow portions may form inductors, electrically coupled between the signal traces and an input and/or output. The circuit board, capacitors and inductors may be positioned in a first enclosure, (e.g., tube), with sealed electrical connections to an exterior. The first enclosure may be positioned in a second enclosure (e.g., tube). The filter may also include a high frequency dissipation filter section employing a metal powder filter, with metal powder and epoxy. Non-magnetic and/or superconducting materials may be employed.

33 Claims, 7 Drawing Sheets

U.S. PATENT DOCUMENTS

| | | | | |
|---|---|---|---|---|
| 7,145,415 | B2 | 12/2006 | Sengupta et al. | 333/174 |
| 2005/0082519 | A1 | 4/2005 | Amin et al. | 257/13 |
| 2005/0184829 | A1 * | 8/2005 | Yoshimoto et al. | 333/185 |
| 2006/0147154 | A1 | 7/2006 | Thom et al. | 385/37 |
| 2006/0225165 | A1 | 10/2006 | Maassen van den Brink et al. | 977/933 |

FOREIGN PATENT DOCUMENTS

| | | | |
|---|---|---|---|
| CA | 2379144 | A1 | 2/2001 |

OTHER PUBLICATIONS

Bladh et al., "Comparison of cryogenic filters for use in single electronics experiements," *Review of Scientific Instruments 74*(3): 1323-1327, Mar. 2003.
U.S. Appl. No. 60/981,764, filed Oct. 22, 2007, Uchaykin.
U.S. Appl. No. 60/988,708, filed Nov. 16, 2007, Uchaykin.
U.S. Appl. No. 12/016,801, filed Jan. 18, 2008, Thom et al.
Blatter et al., "Design aspects of superconducting-phase quantum bits," *Physical Review B 63*: 174511-1-174511-9, 2001.
Farhi et al., "Quantum Adiabatic Evolution Algorithms versus Simulated Annealing," Center for Theoretical Physics, MIT-CTP #3228, arXiv:quant-ph/0201031 vl, pp. 1-16, Jan. 8, 2002.
Feynman, "Simulating Physics with Computers," *International Journal of Theoretical Physics 21*(6/7): 467-488, 1982.
Friedman et al., "Quantum superposition of distinct macroscopic states," *Nature 406*: 43-46, Jul. 6, 2000.
Fukushima et al., "Attenuation of Microwave Filters for Single-Electron Tunneling Experiments," *IEEE Transactions on Instrumentation and Measurement 46*(2): 289-293, Apr. 1997.
Il'ichev et al., "Continuous Monitoring of Rabi Oscillations in a Josephson Flux Qubit," *Physical Review Letters 91*(9): 097906-1-097906-4, week ending Aug. 29, 2003.
Jin et al., "Distributed microwave damping filters for superconducting quantum interference devices," *Appl. Phys. Lett. 70*(16): 2186-2188, Apr. 21, 1997.
Lukashenko et al., "Improved powder filters for qubit measurements," *Review of Scientific Instruments 79*(014701): 1-4, 2008.
Makhlin et al., "Quantum-state engineering with Josephson-junction devices," *Reviews of Modern Physics 73*(2): 357-400, Apr. 2001.
Milliken et al., "50 Ω characteristic impedance low-pass metal powder filters," *Review of Scientific Instruments 78*: 024701-1-024701-5, 2007.
Mooij et al., "Josephson Persistent-Current Qubit," *Science 285*: 1036-1039, Aug. 13, 1999.
Nielsen et al., *Quantum Computation and Quantum Information*, Cambridge University Press, Cambridge, 2000, "7.8 Other implementation schemes," pp. 343-345.
Orlando et al., "Superconducting persistent-current qubit," *Physical Review B 60*(22): 15 398-15 413, Dec. 1, 1999.
Pobell, *Matter and Methods at Low Temperatures*, Springer-Verlag Second edition, 1996, pp. 120-156.
Shor, "Introduction to Quantum Algorithms," AT&T Labs—Research, arXiv:quant-ph/0005003 v2, pp. 1-17, Jul. 6, 2001.
Zorin, "The thermocoax cable as the microwave frequency filter for single electron circuits," *Rev. Sci. Instrum. 66*(8): 4296-4300, Aug. 1995.

* cited by examiner

ELECTRICAL FILTER HAVING A DIELECTRIC SUBSTRATE WITH WIDE AND NARROW REGIONS FOR SUPPORTING CAPACITORS AND CONDUCTIVE WINDINGS

CROSS REFERENCE TO RELATED APPLICATIONS

This application claims benefit under 35 U.S.C. §119(e) of U.S. Provisional Application No. 60/881,358, filed Jan. 18, 2007, which is incorporated herein by reference in its entirety.

BACKGROUND

Field

The present systems, methods, and apparatus relate to the filtering of electrical signals.

Electrical Signal Filtering

During transmission, an electrical signal typically comprises a plurality of components each transmitting at a different frequency. The "filtering" of an electrical signal typically involves the selective removal of certain frequencies from the electrical signal during transmission. Such filtering may be accomplished "passively" or "actively". A passive electrical filter is one that operates without additional power input; that is, the filtering is accomplished by the natural characteristics of the materials or devices through which the electrical signal is transmitted. Many such passive filters are known in the art, including filters that implement lumped elements such as inductors and capacitors, collectively referred to as lumped element filters (LEFs).

Simple, passive lumped element filters include low-pass and high-pass filters. A low-pass filter is one that filters out higher frequencies and allows lower frequencies to pass through. Conversely, a high-pass filter is one that filters out lower frequencies and allows higher frequencies to pass through. The concepts of low-pass and high-pass filters may be combined to produce "band-pass" filters, which effectively transmit a given range of frequencies and filter out frequencies that fall outside (above or below) of that range. Similarly, "band-stop" filters may be implemented which effectively transmit most frequencies and filter out frequencies that fall inside a given range.

Refrigeration

Throughout this specification and the appended claims, various embodiments of the present systems, methods and apparatus are described as being "superconducting" or incorporating devices referred to as "superconductors." According to the present state of the art, a superconducting material may generally only act as a superconductor if it is cooled below a critical temperature that is characteristic of the specific material in question. For this reason, those of skill in the art will appreciate that a system that implements superconducting components may implicitly include a refrigeration system for cooling the superconducting components. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of refrigeration system. Furthermore, those of skill in the art will appreciate that, throughout this specification and the appended claims, the term "superconducting" is used to describe a material that is capable of acting as a superconductor and may not necessarily be acting as a superconductor at all times in all embodiments of the present systems, methods and apparatus.

SUMMARY OF THE INVENTION

At least one embodiment may be summarized as an electrical filter device including a dielectric substrate including a signal surface and a ground surface distinct from the signal surface, the dielectric substrate having an input end and an output end, at least a first wide region between the input and the output ends, the first wide region having a through-hole, and at least a first narrow region between the input and the output ends; a first input conductive trace carried by the signal surface at the input end of the dielectric substrate; a second input conductive trace carried by the ground surface at the input end of the dielectric substrate, wherein the first and second input conductive traces are electrically insulated from one another; a first output conductive trace carried by the signal surface at the output end of the dielectric substrate; a second output conductive trace carried by the ground surface at the output end of the dielectric substrate, wherein the first and second output conductive traces are electrically insulated from one another; a first signal conductive trace carried the signal surface in the first wide region of the dielectric substrate; a first ground conductive trace carried by the ground surface in the first wide region of the dielectric substrate, such that the first signal conductive trace and the first ground conductive trace are electrically insulated from one another; a first length of conductive wire, wherein at least a portion of the first length of conductive wire is wound about the first narrow region of the dielectric medium to form a first inductor; a first capacitor; a first enclosure including a first open end and a second open end, wherein the first enclosure is formed by substantially non-magnetic metal that separates an inner volume of the first enclosure from an exterior thereof, and wherein the dielectric substrate, the first inductor, and the first capacitor are received in the inner volume of the first enclosure; an input connector that is electrically connected to at least one of the first and the second input conductive traces at the input end of the dielectric substrate, wherein the input connector physically couples to the first enclosure, thereby closing the first open end of the first enclosure; and an output connector that is electrically connected to at least one of the first and the second output conductive traces at the output end of the dielectric substrate, wherein the output connector physically couples to the first enclosure, thereby closing the second open end of the first enclosure.

The first capacitor may be positioned in the through-hole of the first wide region with at least one electrical connection between a first end of the first capacitor and the first signal conductive trace and at least one electrical connection between a second end of the first capacitor and the first ground conductive trace, to provide a capacitive coupling between the first signal conductive trace and the first ground conductive trace.

The electrical filter device may further include at least one electrical connection between the first length of conductive wire and at least one of the first and the second input conductive traces; and at least one electrical connection between the first length of conductive wire and the first signal conductive trace.

The first enclosure may include a first hole that connects the inner volume of the first enclosure to the exterior thereof, and the dielectric substrate may be positioned inside the first enclosure such that the first wide region aligns with the first hole in the first enclosure, and a piece of solder may seal the first hole in the first enclosure and that provides an electrical connection between the first ground conductive trace and the first enclosure.

The electrical filter device may further include at least one electrical connection between the first length of conductive wire and at least one of the first and the second output conductive traces. The electrical filter device may further comprise an epoxy mixture that includes an epoxy and a metal powder that is substantially non-superconducting and substantially non-magnetic, wherein at least a portion of the inner volume of the first enclosure may be filled with the epoxy mixture such that at least a portion of the dielectric substrate and at least a portion of the first inductor are embedded in the epoxy mixture.

The dielectric substrate may further have a second wide region between the first wide region and the output end, the second wide region having a through-hole, and a second narrow region between the first and the second wide regions, and the electrical filter device may further include a second signal conductive trace carried by the signal surface of the second wide region of the dielectric substrate; a second ground conductive trace carried by the ground surface of the second wide region of the dielectric substrate, such that the second signal conductive trace and the second ground conductive trace are electrically insulated from one another; a second length of conductive wire, wherein at least a portion of the second length of conductive wire is wound about the second narrow region of the dielectric medium to form a second inductor; and a second capacitor.

The second capacitor may be positioned in the through-hole of the second wide region with at least one electrical connection between a first end of the second capacitor and the second signal conductive trace and at least one electrical connection between a second end of the second capacitor and the second ground conductive trace, to provide a capacitive coupling between the second signal conductive trace and the second ground conductive trace.

The electrical filter device may further include at least one electrical connection between the second length of conductive wire and the first length of conductive wire; and at least one electrical connection between the second length of conductive wire and the second signal conductive trace.

The first enclosure may include a second hole that connects the inner volume of the first enclosure to the exterior thereof, and the dielectric substrate may be positioned inside the first enclosure such that the second wide region aligns with the second hole in the first enclosure, with a piece of solder that seals the second hole in the first enclosure and that provides an electrical connection between the second ground conductive trace and the first enclosure.

The electrical filter device may further include at least one electrical connection between the second length of conductive wire and at least one of the first and the second output conductive traces.

The dielectric substrate may further have a plurality of additional wide regions, each having a respective through-hole and a plurality of additional narrow regions, the additional wide regions and the additional narrow regions alternatively positioned along a longitudinal length of the dielectric substrate between the input end and the output end, and the electrical filter device may further include a plurality of additional signal conductive traces carried at respective ones of the additional wide regions by the signal surface of the dielectric substrate; a plurality of ground conductive traces carried at respective ones of the additional wide regions of the ground surface of the dielectric substrate, such that each of the additional signal conductive traces is electrically insulated from a respective one of the additional ground conductive traces; a plurality of additional lengths of conductive wire, wherein at least a portion of each of the additional lengths of conductive wire in the set of additional lengths of conductive wire is wound about a respective one of the additional narrow regions of the dielectric medium to form a respective additional inductor; and a plurality of additional capacitors.

Each of the additional capacitors may be positioned in the through-hole of a respective one of the additional wide regions with a plurality of electrical connections, a respective one of the electrical connections between a first end of each of the additional capacitors and a respective one of the additional signal conductive traces; a plurality of electrical connections, a respective one of the electrical connections between a second end of each additional capacitor and a respective one of the additional ground conductive traces, to provide a capacitive coupling between each of the additional signal conductive trace and a respective one of the additional ground conductive traces.

Each of the additional lengths of conductive wire may be electrically connected in series with one another and at least one of the additional lengths of conductive wire may be electrically connected in series with the second length of conductive wire, with a respective electrical connection between each of the additional lengths of conductive wire and a respective one of the additional signal conductive traces.

In some embodiments, the first length of conductive wire, the second length of conductive wire, and each of the additional lengths of conductive wire may form respective lengths of one continuous conductive wire.

The first enclosure may include a plurality of additional holes that connect the inner volume of the first enclosure to the exterior thereof and the dielectric substrate may be positioned inside the first enclosure such that each of the additional wide regions aligns with a respective one of the additional holes in the first enclosure, with a plurality of additional pieces of solder that seals a respective one of the additional holes in the first enclosure and that provides an electrical connection between respective ones of each of the additional ground conductive traces and the first enclosure.

The electrical filter device may further include an electrical connection between at least one of the additional lengths of conductive wire and at least one of the first and the second output conductive traces. At least one of the conductive wires may include a material that is superconducting below a critical temperature. At least one of the conductive traces may include a material that is superconducting below a critical temperature. At least one of the input connector and the output connector may be selected from the group consisting of: a coaxial cable, a coaxial connector, an ultra-miniature coaxial cable, an ultra-miniature coaxial cable connector, a single conductor wire, a conductive pin, a solder connection, a spring contact, and an SMA connector.

The electrical filtering device may further include a high frequency dissipation filter electrically coupled in series to at least one of the first and the second output conductive traces. The high frequency dissipation filter may include a metal powder filter including a conductive wire including an input section, an output section, and a wound intermediate section positioned between the input and the output sections; and an epoxy mixture comprising an epoxy and a metal powder that is substantially non-superconducting and substantially non-magnetic, wherein the metal powder filter is enclosed within the first enclosure and the intermediate section of the conductive wire is embedded in the epoxy mixture.

The electrical filter device may further include an output connection that may be in electrical communication with the output section of the conductive wire. The output connection may be selected from the group consisting of: a coaxial cable, a coaxial connector, an ultra-miniature coaxial cable, an ultra-miniature coaxial cable connector, a single conductor wire, a conductive pin, a solder connection, a spring contact, and an SMA connector.

The electrical filter device may further include a second enclosure, at least the intermediate section of the conductive wire may be enclosed by the second enclosure and the second enclosure contains the epoxy mixture, and wherein the second enclosure may be contained within the first enclosure. The first enclosure may be cylindrical and the second enclosure may be cylindrical, and the second enclosure may be concentrically received in the first enclosure. The epoxy mixture may be selected from the group consisting of: approximately two to one by weight of metal powder to epoxy, approximately four to one by weight of metal powder to epoxy, and approximately eight to one by weight of metal powder to epoxy. The conductive wire may include a material that is superconducting below a critical temperature. At least a portion of the dielectric substrate may extend longitudinally through at least a portion of the length of the conductive wire such that at least a portion of the conductive wire is wound about at least a portion of the dielectric substrate. The first enclosure may be tubular. The first enclosure may be cylindrical.

BRIEF DESCRIPTION OF THE SEVERAL VIEWS OF THE DRAWING(S)

In the drawings, identical reference numbers identify similar elements or acts and which may not be described in detail in every drawing in which they appear. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION OF THE INVENTION

Figure 1:
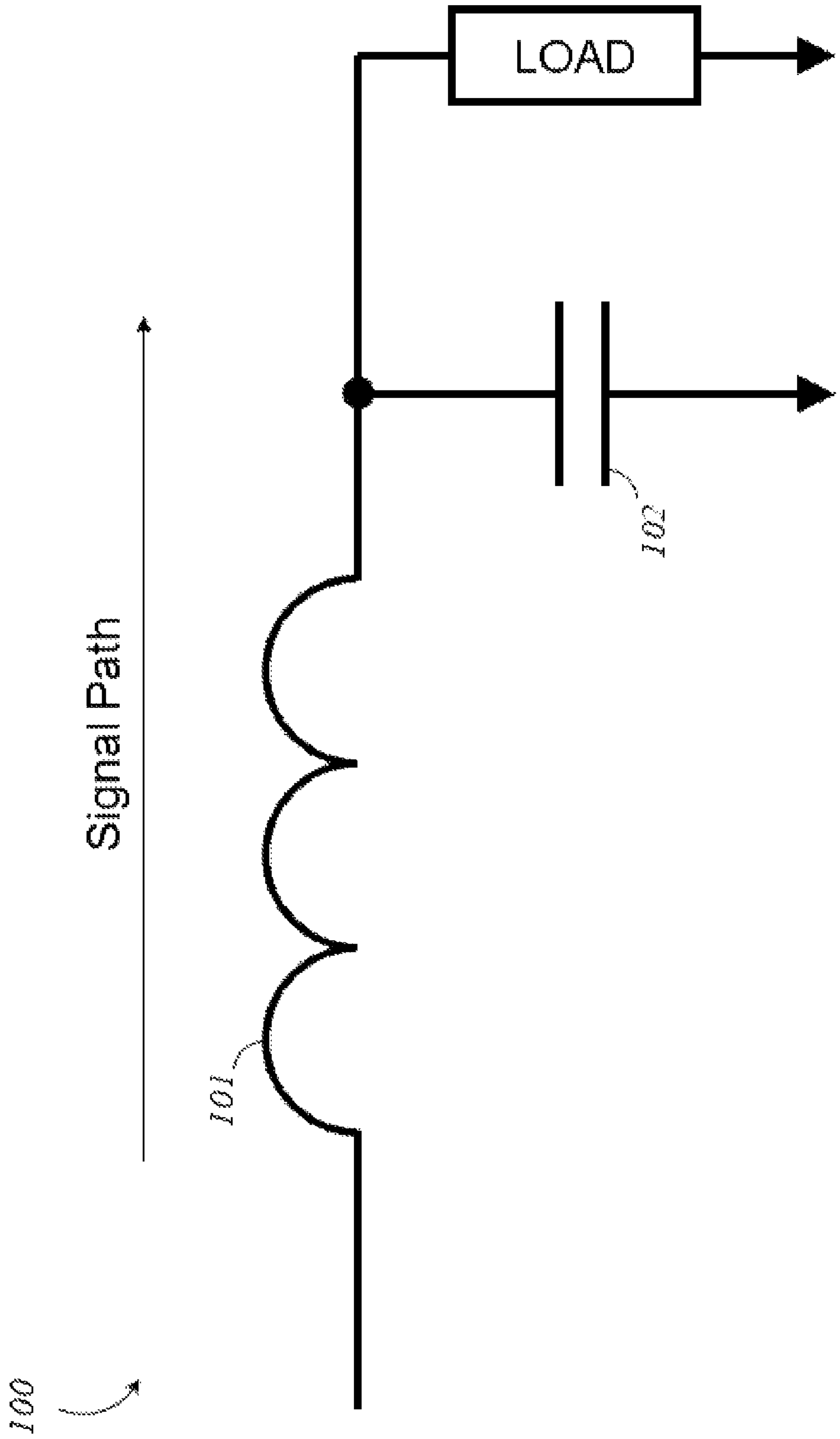
PRIOR ART FIGURE 1
FIG. 1 is a schematic diagram of a typical passive low-pass lumped element filter.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with electrical filters and/or printed-circuit boards have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The present systems, methods and apparatus describe novel techniques for the filtering of electrical signals. Specifically, the techniques described herein implement passive electrical filters based on tubular filter geometries. Many different devices exist for the purpose of passive electrical signal filtering. These devices include filters that implement lumped elements such as inductors and capacitors (lumped element filters, or LEFs) and metal powder filters (MPFs). Such devices are highly adaptable and may typically be adapted to provide the desired performance and range of frequency response for most applications. However, as the performance requirements become more demanding, the manufacture or assembly of many of these existing filter devices can become complicated and labor-intensive. Furthermore, in systems that incorporate a large number of signal lines, and therefore a large number of filters, these known filtering devices can take up a lot of space. In superconducting applications within a refrigerated environment, space is limited. Thus, there is a need in the art for passive electrical signal filtering devices that may be readily manufactured or assembled within a compact volume, while still providing the desired performance and range of frequency response for a wide variety of applications.

Those of skill in the art will appreciate that some or all of the various concepts taught in the present systems, methods and apparatus may be applied in designs of low-pass, high-pass, band-pass, and band-stop applications. Throughout the remainder of this specification, specific structures relating to passive low-pass filters are described; however, those of skill in the art will appreciate that the concepts taught herein may be adapted to meet other filtering requirements, such as high-pass, band-pass, and band-stop filtering.

FIG. 1 is a schematic diagram of a typical passive low-pass lumped element filter (LEF) 100. LEF 100 includes an inductor 101 that is coupled within the signal path (i.e., in series with the load) and a capacitor 102 that couples the signal path to ground (i.e., in parallel with the load). An impedance of inductor 101 naturally increases as the frequency of the signal passing through it increases. This means that inductor 101 allows low-frequency signals to pass through but naturally blocks high-frequency signals from propagating along the signal path. Conversely, an impedance of capacitor 102 naturally decreases as the frequency of the signal passing through it increases. This means that capacitor 102 couples high-frequency signals directly to ground and naturally forces low-frequency signals to propagate along the signal path. Thus, LEF 100 has two mechanisms by which high-frequency signals are filtered out of the electrical signal: inductor 101 blocks the flow of some high-frequency signals but permits low-frequency signals to pass through, and capacitor 102 provides a short to ground for some high-frequency signals but forces low-frequency signals to carry-on along the signal path towards the load.

Throughout this specification and the appended claims, the term "signal path" is used to describe a conductive conduit through or upon which an electrical signal may be propagated. In the illustrated embodiments, such paths are realized by conductive wires and/or conductive traces on printed circuit boards (PCBs). However, as previously described a typical electrical signal may comprise multiple signal frequencies and, during filtering, various frequencies may follow different signal paths. An electrical filter may be designed such that the signal frequency of interest propagates through the filter while all undesirable frequencies are filtered out. Thus, the term "signal path" is used herein to describe the route traveled by the particular electrical signal for which filtering is desired as it passes through an electrical filter.

The present systems, methods and apparatus describe embodiments of an electrical filter that is tubular in geometry (hereinafter referred to as a "tubular filter structure"). The filter device itself comprises a plurality of lumped elements (e.g., inductors and capacitors) connected to at least one PCB, while the tubular aspect relates to a cylindrical shield in which the filter device is enclosed. The PCB serves both as a signal-carrying device and as a structural device. For illustrative purposes, the embodiments described herein are passive low-pass filters such as LEF 100 from FIG. 1; however, as previously discussed those of skill in the art will appreciate that the concepts taught herein may be adapted to meet other filtering requirements, such as high-pass, band-pass, and band-stop filtering.

Figure 2A:
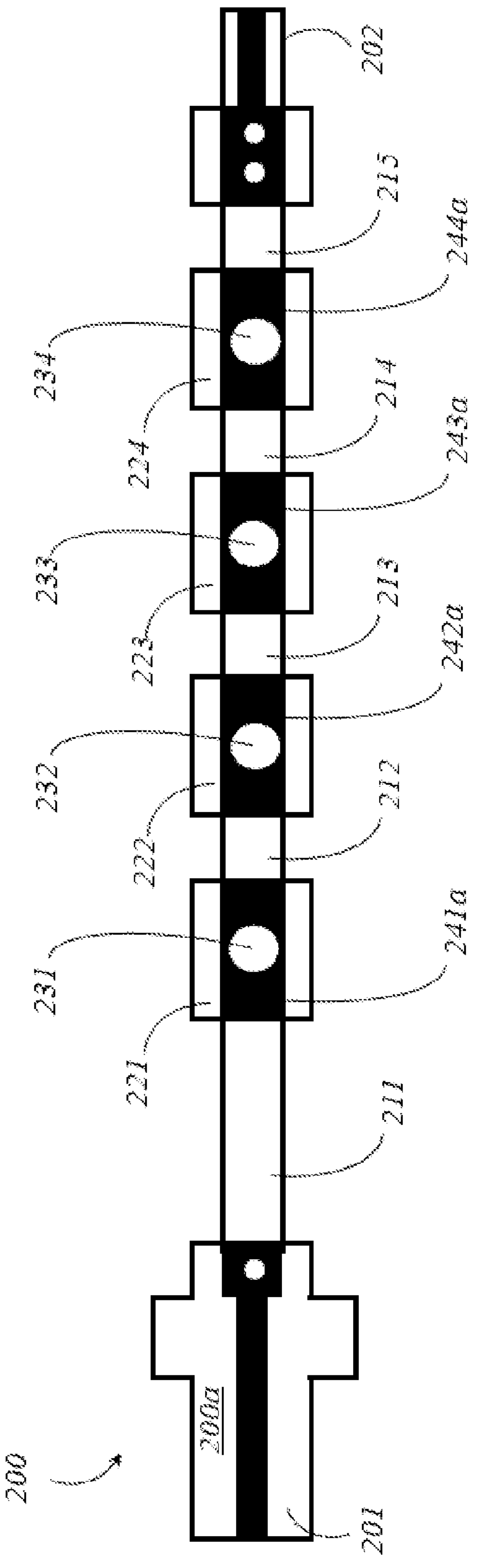
FIG. 2A is a top plan view of an embodiment of a printed circuit board for use in a tubular filter structure, showing a first surface upon which the signal path is carried.

FIG. 2A is a top plan view of an embodiment of a PCB 200 for use in a tubular filter structure, showing a first surface 200*a* upon which the signal path is carried. PCB 200 includes a dielectric substrate and a plurality of conductive traces (represented by solid dark regions in the Figure). While illustrated as a top outer surface of the PCB 200, in some embodiments the first surface 200*a* may be an inner surface, formed as one of multiple layers of PCB 200. PCB 200 also includes an input end 201, an output end 202, as well as a plurality of necked or narrow regions 211, 212, 213, 214 and 215 and wide regions 221, 222, 223 and 224. Each of wide regions 221, 222, 223 and 224 includes a respective through-hole 231, 232, 233 and 234. On the first surface 200*a* of PCB 200, each of wide regions 221, 222, 223 and 224 includes a respective conductive trace 241*a*, 242*a*, 243*a*, 244*a*, but each of conductive traces 241*a*, 242*a*, 243*a* and 244*a* covers only a portion of a respective wide region 221, 222, 223 and 224. Each of narrow regions 211, 212, 213, 214 and 215 includes only dielectric substrate. Both input end 201 and output end 202 may be wider than narrow regions 211, 212, 213, 214 and 215 to improve support of the PCB 200 when placed with a shielded enclosure (see FIGS. 5A and 5B).

Figure 2B:
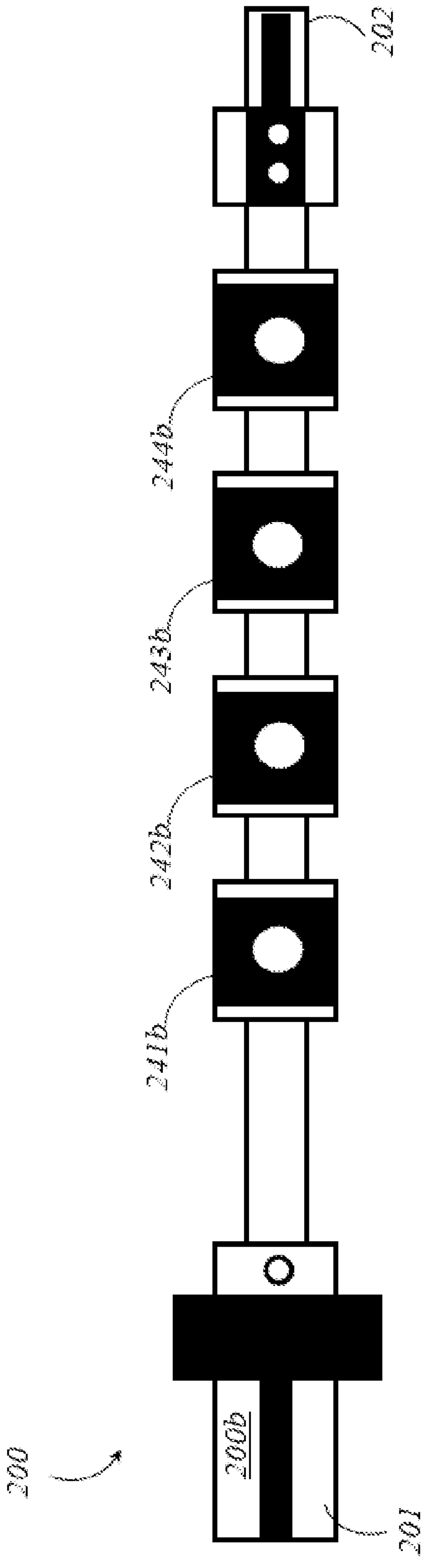
FIG. 2B is a bottom plan view of an embodiment of a printed circuit board for use in a tubular filter structure, showing a second surface upon which the ground path is carried.

FIG. 2B is a bottom plan view of PCB 200, showing a second surface 200*b* upon which the ground path is carried. While illustrated as a bottom outer surface of the PCB 200, in some embodiments the second surface 200*b* may be an inner surface, formed as one of multiple layers of PCB 200. The second surface 200*b* includes the same narrow regions 211, 212, 213, 214 and 215 and wide regions 221, 222, 223 and 224 with through-holes 231, 232, 233 and 234 as the first surface 200*a* as shown in FIG. 2A. However, each of conductive traces 241*b*, 242*b*, 243*b* and 244*b* on the second surface 200*b* covers a greater surface area of wide regions 221, 222, 223 and 224, respectively, than that covered by conductive traces 241*a*, 242*a*, 243*a* and 244*a* on the first surface 200*a* as shown in FIG. 2A. In some embodiments, conductive traces 241*b*, 242*b*, 243*b* and 244*b* may extend over and cover at least a portion of the sides (e.g., thickness or perimeter edge) of wide regions 221, 222, 223 and 224 of PCB 200. However, it is important to note that there is no electrically conductive path connection between conductive traces on first surface 200*a* of PCB 200 and those on second surface 200*b* of PCB 200.

Figure 3:
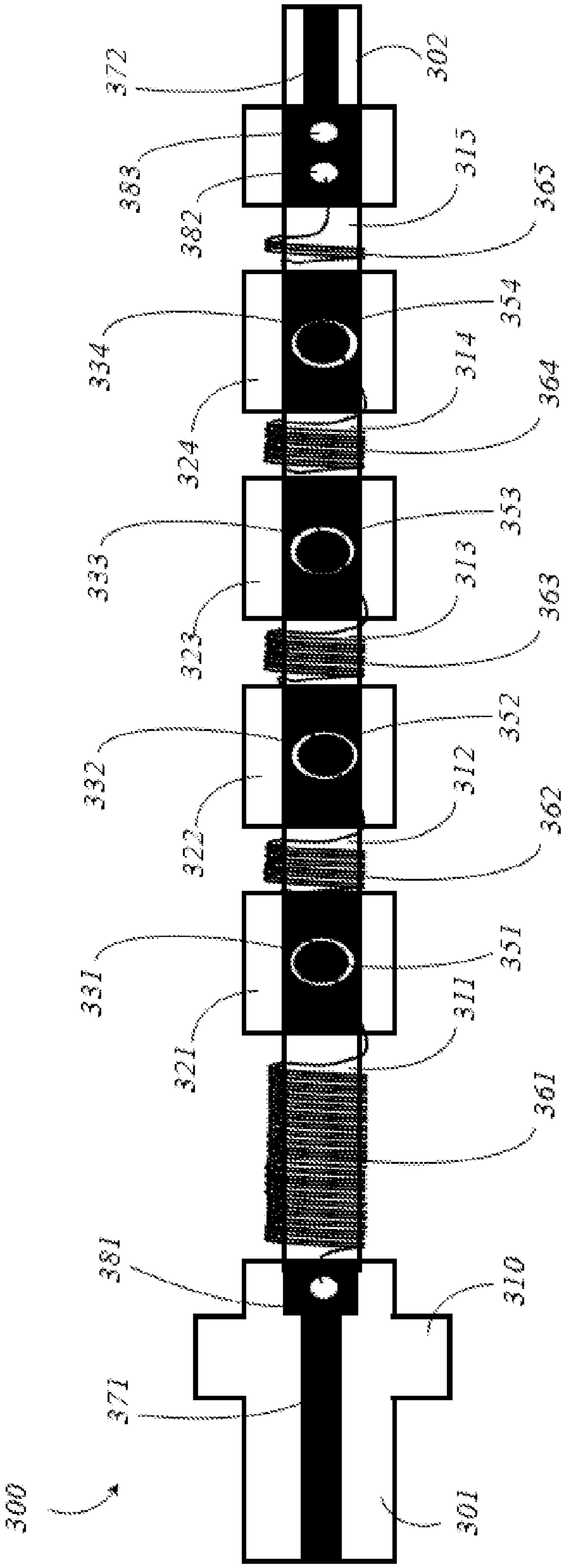
FIG. 3 is a top plan view of an embodiment of a filtering device comprising a printed circuit board with lumped elements, for use in a tubular filter structure.

PCB 200 provides some signal-carrying functionality on a structural base for lumped element devices (e.g., inductors and capacitors) in a tubular filter structure. FIG. 3 is a top plan view of an embodiment of a filtering device 300 comprising a PCB 310 with lumped elements, for use in a tubular filter structure. Note that PCB 310 is, for all intents and purposes, the same as PCB 200 from FIGS. 2A and 2B, and FIG. 3 shows the signal surface (200*a*) of PCB 310 as distinguishable by the widths of the conductive traces (represented by solid dark regions in the Figure) on the wide regions 321, 322, 323 and 324. In filtering device 300, each of through-holes 331, 332, 333 and 334 receives a respective lumped element capacitor 351, 352, 353 and 354. While capacitors 351, 352, 353 and 354 are illustrated as being cylindrical, those of skill in the art will appreciate that capacitors of other geometries (such as rectangular or square) may similarly be used. Capacitors 351, 352, 353 and 354 may include a respective contact point on both of two opposing ends (such as in, for example, an SMD capacitor), and they may be soldered in place by connections to the conductive traces on both surfaces of PCB 310. Thus, capacitors 351, 352, 353 and 354 provide capacitive coupling between the conductive traces on both surfaces of wide regions 321, 322, 323 and 324. More specifically, capacitors 351, 352, 353 and 354 may provide capacitive coupling from the signal path (carried on the surface shown in FIG. 3; i.e., surface 200*a*) and the ground path (carried on the surface opposing that shown in FIG. 3; i.e., surface 200*b*), thereby realizing the same capacitive coupling to ground as that illustrated for LEF 100 in FIG. 1. In some embodiments, each capacitor 351, 352, 353 and 354 may be sized to provide an interference fit in a respective through-hole 331, 332, 333 and 334.

As is also shown in FIG. 3, each of narrow regions 311, 312, 313, 314 and 315 is wound by a respective section of conductive wire to form lumped element inductors 361, 362, 363, 364 and 365. In some embodiments, each of lumped element inductors 361, 362, 363, 364 and 365 may be realized by a separate wound length of one continuous conductive wire. In such embodiments, the continuous conductive wire may be soldered to the conductive trace on each of wide regions 321, 322, 323 and 324, or the continuous conductive wire may simply pass over and electrically contact (as is shown in the Figure) the conductive trace and/or capacitor at each of wide regions 321, 322, 323 and 324. In order to establish an electrically connection with the conductive trace and/or capacitor, any resistive/insulative cladding that may cover the continuous conductive wire may need to be stripped from the portion of the continuous conductive wire that passes over the conductive trace and/or capacitor. In other embodiments, each of lumped element inductors 361, 362, 363, 364 and 365 may be realized by a separate piece of wound conductive wire. In such embodiments, each of lumped element inductors 361, 362, 363, 364 and 365 is soldered at both ends to a conductive trace on the signal surface of PCB 310. For example, inductor 362 may be soldered to the conductive traces on the signal surface of wide regions 321 and 322.

PCB 310 of filtering device 300 also includes an input conductive trace 371 at an input end 301 and an output conductive trace 372 at an output end 302. Any input signal (not shown) may be coupled to input conductive trace 371, which is then electrically coupled (i.e., by a solder connection) to the first inductor 361 in the signal path. Through-hole 381 provides an anchoring point for the input end of the first inductor 361. Similarly, the filtered signal may be output by coupling to any output path (not shown) through output conductive trace 372. The last inductor 365 is electrically coupled to output conductive trace 372 (i.e., by a solder connection) and through-holes 382 and 383 provide anchoring points for securing the last inductor 365 and the output connection, respectively.

In filtering device 300, lumped element inductors 361, 362, 363, 364 and 365 are coupled in series with the signal path, thereby realizing the low-pass filtering characteristics of LEF 100 illustrated in FIG. 1. As will be apparent to those of skill in the art, filtering device 310 realizes a multi-stage low-pass filter that may be adapted to incorporate any number of inductors and/or capacitors. FIG. 3 shows five inductors (361, 362, 363, 364 and 365), each corresponding to a respective narrow region 311, 312, 313, 314 and 315 of PCB 310, and four capacitors (351, 352, 353 and 354), each corresponding to a respective wide region 321, 322, 323 and 324 of PCB 310. Those of skill in the art will appreciate that more or fewer inductors and/or capacitors may be incorporated into a similar filter device structure by incorporating the appropriate corresponding narrow/wide regions in PCB 310. Furthermore, those of skill in the art will appreciate that each of inductors 361, 362, 363, 364 and 365 may be any size (where a larger inductor may require a longer stretch of narrow region in the PCB) and each of capacitors 351, 352, 353 and 354 may similarly be any size (where a larger capacitor may require a larger diameter through-hole 331, 332, 333 and 334). Both the size and number of lumped element devices may be adapted to provide the filtering performance desired in any specific implementation.

In a low-pass configuration, filtering device 300 is well-suited to remove frequencies up to several GHz. However, beyond that, the lumped elements of filtering device 300 may be unable to provide satisfactory filtering by themselves. In applications where it is desirable to remove frequencies in the microwave range, filtering device 300 may be combined with a high frequency dissipative filter, such as a metal powder filter. The principles governing the operation of typical metal powder filters are described in F. P. Milliken et al., 2007, *Review of Scientific Instruments* 78, 024701 and U.S. Provisional Patent Application Ser. No. 60/881,358 filed Jan. 18, 2007 and entitled "Input/Output System and Devices for Use with Superconducting Based Computing Systems."

Figure 4:
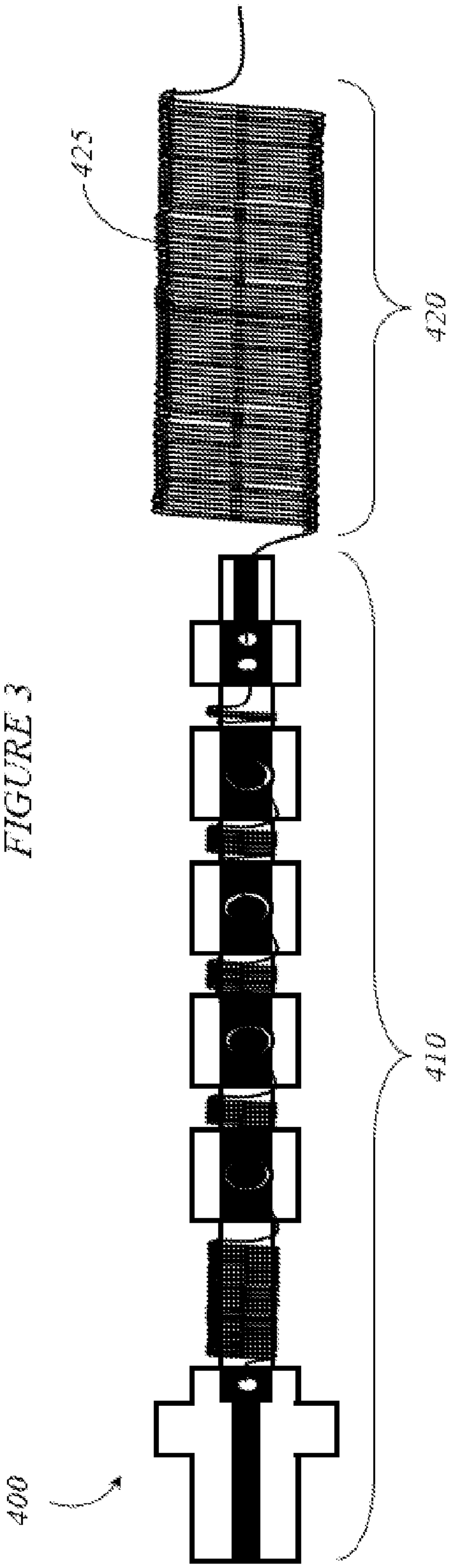
FIG. 4 is a top plan view of an embodiment of a filtering device that includes a printed circuit board component and a portion of a high frequency dissipative filter component.

FIG. 4 is a top plan view of an embodiment of a filtering device 400 that includes a PCB component 410 and a portion of a high frequency dissipative filter component 420. In the illustrated embodiment, PCB component 410 is structurally and functionally similar to filtering device 300 from FIG. 3. Electrically coupled to the output end of PCB component 410, a high frequency dissipative filter 420 includes a wound conductive wire 425. Wound conductive wire 425 embodies a portion of a metal powder filter structure. As previously described, the various embodiments of filtering devices described herein may be enclosed in a cylindrical shield to form a tubular filter structure. In such embodiments, the metal powder filter structure of high frequency filter component 420 may be completed by enclosing wound conductive wire 425 in a cylindrical shield full of a metal powder/epoxy mixture. The metal powder epoxy mix serves to hold the wire 425 in place and provides a medium for high frequency signals to flow from the wire 425 and dissipate, for example via eddy currents. The metal powder/epoxy mixture also helps to thermalize the components of filtering device 400.

Throughout this specification and the appended claims, the term "epoxy" is frequently used to describe an insulating compound; however, those of skill in the art will appreciate that this term is not intended to limit the various embodiments described herein, and embodiments that include epoxy material may alternatively employ resin or another insulating compound in a similar fashion.

In alternative embodiments, it can be advantageous to realize a dissipative filter similar to high frequency dissipation filter 420 by simply potting PCB filter component 410 (i.e., filtering device 300) in metal powder epoxy without including wound conductive wire 425. Such embodiments may include at least one additional narrow region in PCB 410 that is wound by a respective length of conductive wire to form an additional inductor similar to inductors 361, 362, 363, 364 and 365. Thus, in some embodiments, a narrow region of PCB 410 may extend longitudinally through the length of wound conductive wire 425 such that wire 425 is wound about the extended narrow region of PCB 410, thereby increasing the rigidity of wound conductive wire 425. Furthermore, in some embodiments the performance of high frequency dissipation filter 420 may be improved by cladding wire 425 with a copper-nickel alloy.

Figure 5A:
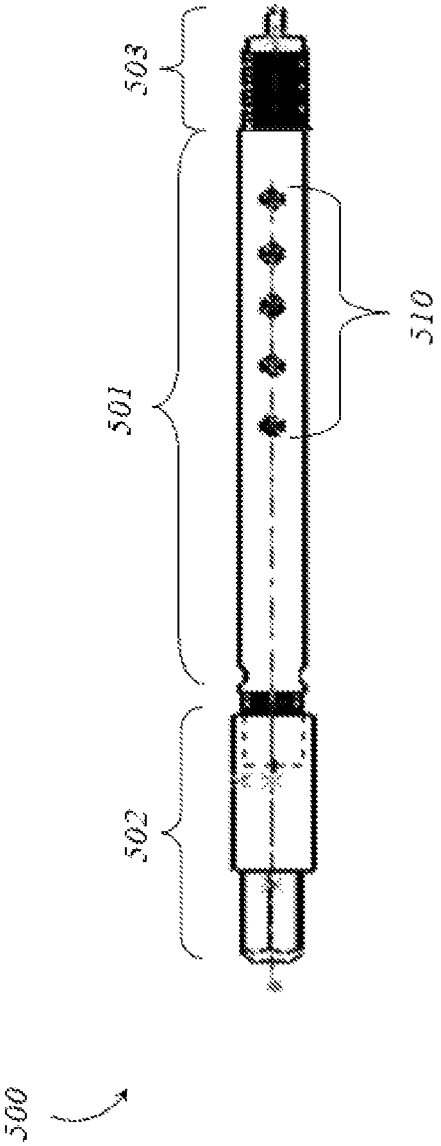
FIG. 5A is a plan view of an embodiment of a tubular filter structure.

FIG. 5A is a plan view of an embodiment of a tubular filter structure 500. Tubular filter structure 500 includes a substantially cylindrical body 501 that is connected to an input connection adapter 502 and an output connection adapter 503. Adapters 502 and 503 may take the form of any electrical connector, including but not limited to: SMA connectors, coaxial connectors, or ultra-miniature coaxial connectors, conductive pins, solder connections, and spring contacts. In some embodiments, adapters 502, 503 may each connect directly to a conducting wire, coaxial cable, or ultra-miniature coaxial cable. In embodiments incorporating many signal lines, each with a respective tubular filter structure, the packing density of tubular filter structures 500 may be limited by the diameter (or width) of adapters 502, 503. Thus, tubular filter structure 500 may be advantageous because it may be coupled to small, space-conserving electrical cables or connection adapters.

Though not visible in the Figure, cylindrical body 501 is hollow, having a cavity that contains a filtering device similar to filtering device 300 from FIG. 3. In some embodiments, it is advantageous to ensure that the cavity of cylindrical body 501 has an inner diameter that is approximately equal to the width of the wide regions (i.e., wide regions 321, 322, 323 and 324) of the filtering device, or at least sized such that the filtering device fits securely therein (e.g., interference fit). The filtering device 300 is inserted into the cavity of cylindrical body 501 such that each of the wide regions (i.e., wide regions 321, 322, 323 and 324) of the filtering device aligns with a respective hole 510 (collectively) in the cylindrical body 501. The input conductive trace (i.e., 371) of the filtering device 300 is electrically connected to input connection adapter 502 and the output conductive trace (i.e., 372) is electrically connected to the output connection adapter 503.

With the filtering device 300 contained in the cylindrical body 501 such that the wide regions (i.e., wide regions 321, 322, 323 and 324) each align with a respective hole 510, the holes 510 may be sealed with solder. This solder provides electrical connections between the cylindrical body 501 and the respective conductive traces on the "ground" surface (i.e., second surface 200*b* as shown in FIG. 2B) and, in some embodiments, on the sides of the PCB. This solder also serves to seal the holes 510, such that the cylindrical body 501 and input and output connection adapters 502, 503 form a sealed enclosure about the filtering device 300. This sealed enclosure can advantageously help to shield the filtering device 300 from E&M noise. In order to enhance this effect, in some embodiments it is advantageous to ensure that tubular filter structure 500 is formed of substantially non-magnetic materials. In some embodiments, copper metal may be used to form cylindrical body 501.

Figure 5B:
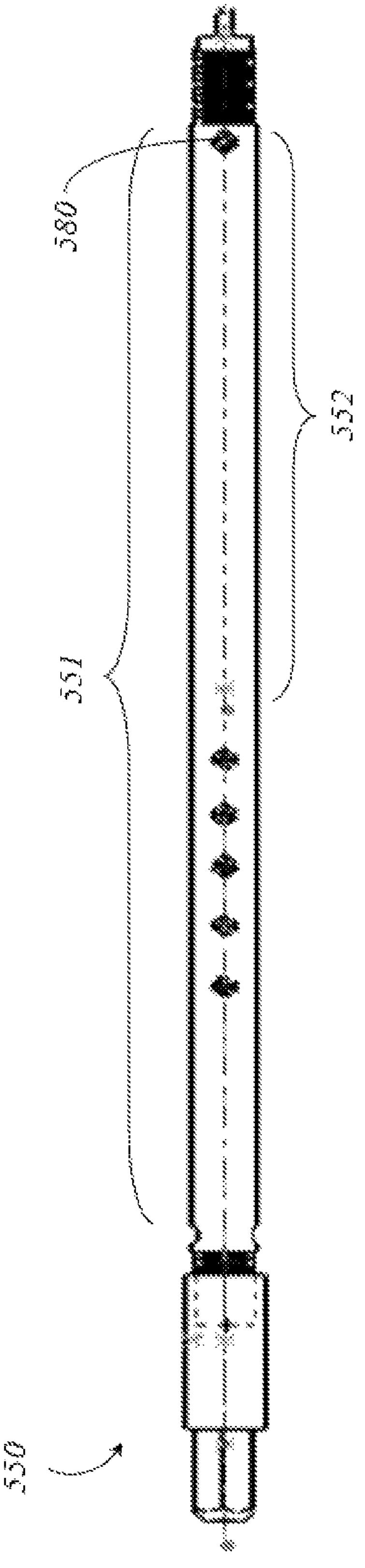
FIG. 5B is a plan view of an embodiment of a tubular filter structure that includes a high frequency dissipative filter component.

Embodiments of the present systems, methods and apparatus that include a high frequency dissipative filter component (i.e., filter 400 from FIG. 4) may similarly be enclosed within a cylindrical body. FIG. 5B is a plan view of an embodiment of a tubular filter structure 550 that includes a high frequency dissipative filter component (not visible in the Figure). Tubular filter structure 550 is substantially similar to tubular filter structure 500 as shown in FIG. 5A, except that the cylindrical body portion 551 is extended to accommodate the length of the high frequency dissipative filter component. Thus, tubular filter structure 550 has a cavity that contains a filtering device similar to filtering device 400 from FIG. 4. Furthermore, in some embodiments at least the extended portion 552 of cylindrical body 551 may be filled with a metal powder/epoxy mixture as previously discussed. Tubular filter structure 550 also includes a fill hole (not shown) and a vent hole 580, both of which are used to fill the cylindrical body 551 with the metal powder/epoxy mixture. For example, metal powder epoxy may be injected by a syringe that is inserted into the fill hole (not shown), while vent hole 580 provides a path for air trapped within the cylindrical body 551 to escape as cylindrical body 551 fills with metal powder epoxy. Once the desired volume of metal powder epoxy has been injected into tubular filter structure 550, both the vent hole 580 and the fill hole (not shown) may be sealed (e.g., with solder). In alternative embodiments, the high frequency dissipative filter component (i.e., component 420 in FIG. 4) may first be enclosed in its own cylindrical casing (not illustrated), which is then itself enclosed in cylindrical body 551. In such embodiments, only the first enclosure that contains the high frequency dissipative filter component may be filled with the metal powder/epoxy mixture.

Similar to tubular filter structure 500, in some embodiments it can be advantageous to ensure that the various components of tubular filter structure 550 are formed by substantially non-magnetic materials. In some embodiments, cylindrical body 551 may be formed of copper metal. In embodiments that include a nested internal enclosure about the high frequency dissipative filter component, the nested internal enclosure may be formed of copper metal.

In embodiments that include a metal powder filter structure, an epoxy mixture comprising an epoxy and a metal powder that is substantially non-superconducting and substantially non-magnetic may be implemented. The metal powder may include at least one of copper and brass. In some embodiments, a ratio of the epoxy mixture may be selected from the group consisting of: approximately two to one by weight of metal powder to epoxy, approximately four to one by weight of metal powder to epoxy, and approximately eight to one by weight of metal powder to epoxy.

Figure 6:
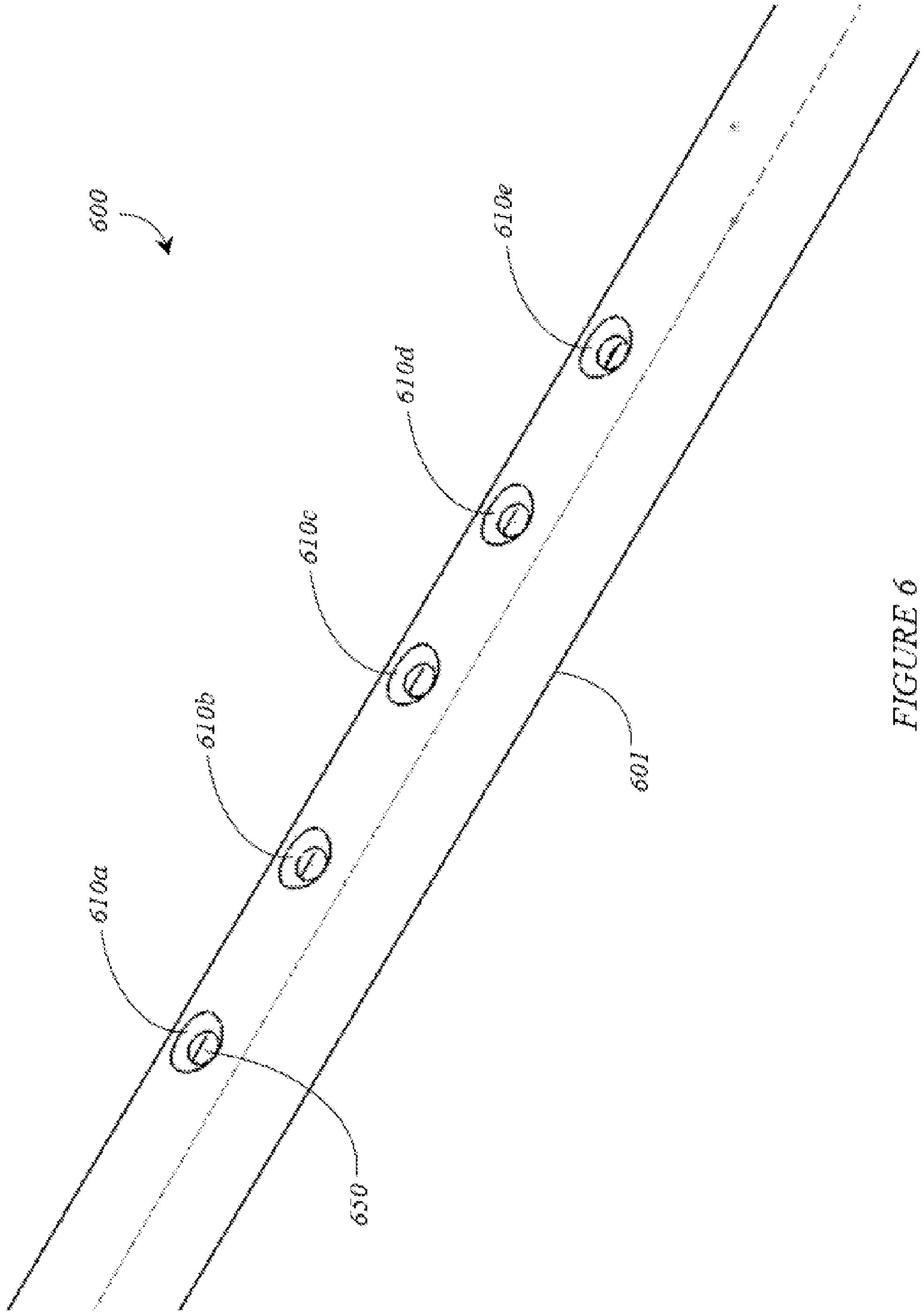
FIG. 6 is an isometric view of a portion of an embodiment of a tubular filter structure, showing the alignment of the filtering device within the cylindrical body.

As previously discussed, when inserted into a cylindrical body (such as cylindrical body 501 as shown in FIG. 5), a filtering device (such as filtering device 300 as shown in FIG. 3) may be positioned such that each wide region (i.e., wide regions 321, 322, 323 and 324 as shown in FIG. 3) aligns with a respective hole (i.e., 510 as shown in FIG. 5) in the cylindrical body (i.e., 501). FIG. 6 is an isometric view of a portion of an embodiment of a tubular filter structure 600, showing the alignment of the filtering device 650 within the cylindrical body 601. Respective wide regions (i.e., wide regions 321, 322, 323 and 324) of filtering device 650 are visible through each of holes 610*a*, 610*b*, 610*c*, 610*d* and 610*e*. However, as is visible in the Figure, the wide regions (i.e., 321, 322, 323 and 324) are not positioned so that their sides are flush with the holes 610*a*, 610*b*, 610*c*, 610*d*, and 610*e*, but rather the filtering device 650 is positioned such that the edge that joins a side of the PCB with the ground surface (i.e., 200*b*) points towards the holes 610*a*, 610*b*, 610*c*, 610*d*, and 610*e*.

Figure 7:
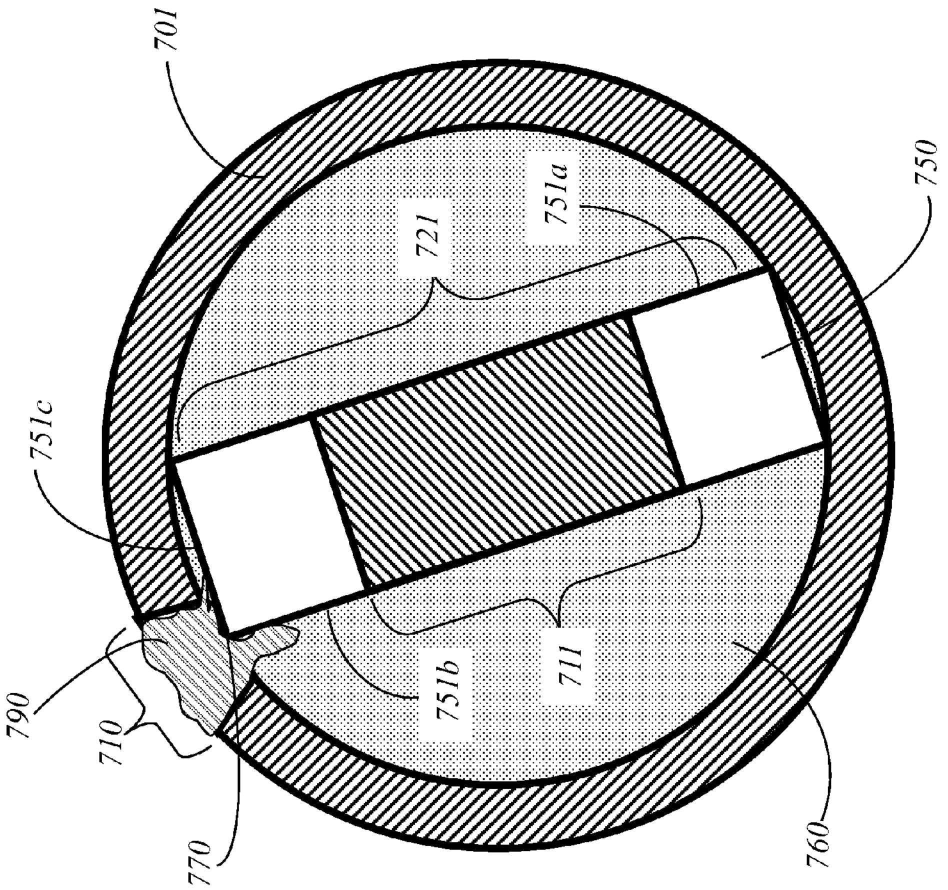
FIG. 7 is a cross-sectional view showing the alignment of a filtering device inside a cylindrical body.

FIG. 7 is a cross-sectional view showing the alignment of a filtering device 750 inside a cylindrical body 701. As previously described, in some embodiments it can be advantageous to position filtering device 750 inside cylindrical body 701 such that the edge 770 that joins a side 751*c* of the PCB with the ground surface 751*b* points towards the hole 710. FIG. 7 shows a solder connection 790 that seals hole 710 and establishes an electrical connection between the cylindrical body 701 and the conductive trace that covers a portion of the ground surface 751*b* of wide region 721 and, in some embodiments, a portion of the side 751*c* of the PCB. Note that the signal surface 751*a* and the narrow region 711 of the PCB are both electrical isolated from the solder connection 790 and the cylindrical body 701. As previously described in the context of FIG. 4, it can be advantageous to realize a dissipative filter by potting filtering device 750 in an epoxy mixture 760 comprising an epoxy and a metal powder.

Figure 8:
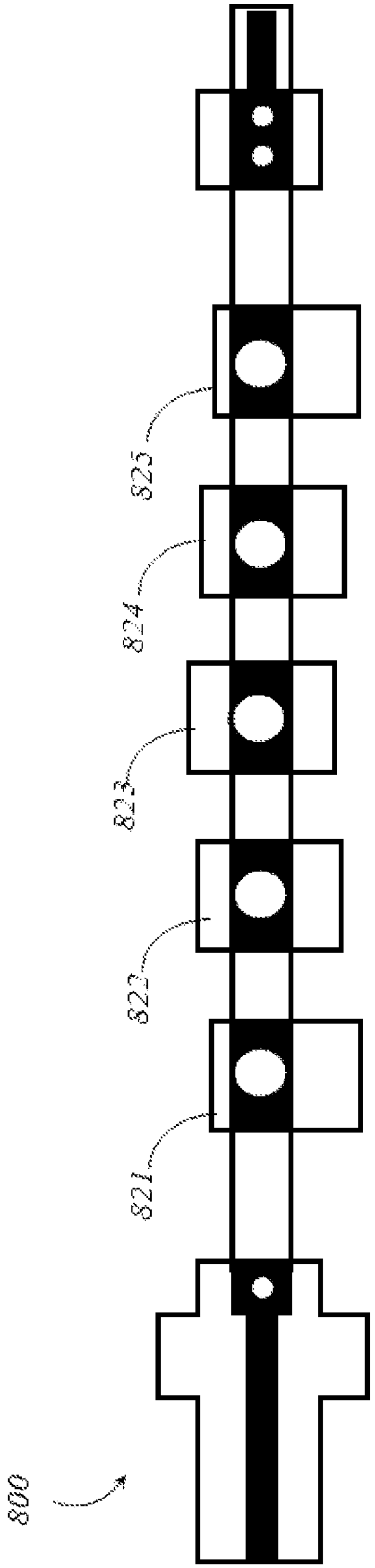
FIG. 8 is a top plan view of an embodiment of a printed circuit board for use in a tubular filter structure, showing staggered wide regions.

In order to ensure that the filtering device fits securely inside the cylindrical body, in some embodiments it can be advantageous to vary the widths of the wide regions of the PCB and/or stagger the wide regions such that at least one wide region physically couples to an adjacent narrow region at an off-centre position along its width. FIG. 8 is a top plan view of an embodiment of a PCB 800 for use in a tubular filter structure, showing staggered wide regions 821, 822, 823, 824 and 825. As illustrated in the Figure, each of wide regions 821, 822, 823, 824 and 825 has approximately the same width, but at least some of wide regions 821, 822, 823, 824 and 825 are shifted (compared to the wide regions in PCB 200) above or below the centerline of PCB 800. Specifically, wide regions 821 and 825 are shifted substantially downwards so that a substantially greater width of dielectric substrate extends below the centerline of PCB 800 than above the centerline of PCB 800 at wide regions 821 and 825. In alternative embodiments, any wide region may have any width, the only restriction being that the PCB must fit inside the cylindrical body in the tubular filter structure. In some embodiments, it can be advantageous to stagger the wide regions because, when inserted into a cylindrical body, this can force the PCB 800 to bend and introduce a normal force against the inner wall of the cylindrical body, thereby increasing friction and helping to secure the PCB 800 in place inside the cylindrical body.

The various embodiments described herein incorporate conductive wires and conductive traces in tubular filter structures. In some applications, it may be desirable to use these tubular filter structures to filter superconducting electrical signals. Thus, in some embodiments, the various conductive wires (including wound inductors such as inductors 361, 362, 363, 364 and 365 and the wound conductive wire 425 in the high frequency dissipative filtering component 420) may be formed of a material that is superconducting below a critical temperature. An example of such a material is niobium, or niobium-titanium with copper cladding, though those of skill in the art will appreciate that other superconducting materials may similarly be used. Furthermore, in some embodiments, the various conductive traces (including conductive traces 241*a*, 242*a*, 243*a* and 244*a* and 241*b*, 242*b*, 243*b* and 244*b*) may be formed of a material that is superconducting below a critical temperature. In PCB technology, a typically approach for providing superconducting traces is to first lay out the conductive traces on the surface of the PCB using a non-superconducting metal (e.g., copper) and then to plate the surface of the non-superconducting metal with a superconducting metal (e.g., tin). Again, those of skill in the art will appreciate that materials other than those given as examples herein may similarly be used.

In some embodiments that incorporate superconducting components, it can be advantageous to form superconducting connections at solder joints by implementing superconducting solder. Thus, in some embodiments, the signal path may be entirely superconducting from input to output in a tubular filter structure. However, in alternative embodiments a superconducting signal path may be interrupted by non-superconducting segments.

In embodiments of the present systems, methods and apparatus that incorporate superconducting materials, it can be advantageous to ensure that the cylindrical body (e.g., cylindrical body 501) of the tubular filter structure is formed by a substantially non-superconducting material. Using a non-superconducting material for the cylindrical body may improve thermalization of the tubular filter structure.

Throughout this specification and the appended claims, various embodiments and devices are described as being "cylindrical" and/or "tubular" in geometry. However, those of skill in the art will appreciate that the concepts taught herein may be applied using alternative geometries, such as rectangular prisms, triangular prisms, curved or flexible tubes, etc.

Throughout this specification and the appended claims, the term "non-magnetic" is used to describe a material that is substantially non-ferromagnetic.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to electrical signal filtering systems, methods and apparatus, not necessarily the exemplary electrical signal filtering systems, methods, and apparatus generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 60/881,358 filed Jan. 18, 2007 and entitled "Input/Output System and Devices for Use with Superconducting Based Computing Systems" and U.S. Nonprovisional patent application Ser. No. 12/016,801 filed Jan. 18, 2008 and entitled "Input/Output System and Devices for Use with Superconducting Devices", are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrical filter device comprising:

a dielectric substrate including a signal surface and a ground surface distinct from the signal surface, the dielectric substrate having an input end and an output end, a first wide region between the input and the output ends, the first wide region having a through-hole, and a first narrow region between the input and the output ends;

a first input conductive trace carried by the signal surface at the input end of the dielectric substrate;

a second input conductive trace carried by the ground surface at the input end of the dielectric substrate, wherein the first and second input conductive traces are electrically insulated from one another;

a first output conductive trace carried by the signal surface at the output end of the dielectric substrate;

a second output conductive trace carried by the ground surface at the output end of the dielectric substrate, wherein the first and second output conductive traces are electrically insulated from one another;

a first signal conductive trace carried by the signal surface in the first wide region of the dielectric substrate;

a first ground conductive trace carried by the ground surface in the first wide region of the dielectric substrate, such that the first signal conductive trace and the first ground conductive trace are electrically insulated from one another;

a first length of conductive wire, wherein at least a portion of the first length of conductive wire is wound about the first narrow region of the dielectric substrate to form a first inductor;

a first capacitor;

a first enclosure including a first open end and a second open end, wherein the first enclosure is formed by substantially non-magnetic metal that separates an inner volume of the first enclosure from an exterior thereof, and wherein the dielectric substrate, the first inductor, and the first capacitor are received in the inner volume of the first enclosure;

an input connector that is electrically connected to at least one of the first and the second input conductive traces at the input end of the dielectric substrate, wherein the input connector physically couples to the first enclosure, thereby closing the first open end of the first enclosure; and an output connector that is electrically connected to at least one of the first and the second output conductive traces at the output end of the dielectric substrate, wherein the output connector physically couples to the first enclosure, thereby closing the second open end of the first enclosure.

2. The electrical filter device of claim 1 wherein the first capacitor is positioned in the through-hole of the first wide region, and further comprising:

at least one electrical connection between a first end of the first capacitor and the first signal conductive trace; and at least one electrical connection between a second end of the first capacitor and the first ground conductive trace, to provide a capacitive coupling between the first signal conductive trace and the first ground conductive trace.

3. The electrical filter device of claim 2, further comprising:

at least one electrical connection between the first length of conductive wire and at least one of the first and the second input conductive traces; and at least one electrical connection between the first length of conductive wire and the first signal conductive trace.

4. The electrical filter device of claim 3 wherein the first enclosure includes a first hole that connects the inner volume of the first enclosure to the exterior thereof, and wherein the dielectric substrate is positioned inside the first enclosure such that the first wide region aligns with the first hole in the first enclosure, and further comprising:

a piece of solder that seals the first hole in the first enclosure and that provides an electrical connection between the first ground conductive trace and the first enclosure.

5. The electrical filter device of claim 4, further comprising:

at least one electrical connection between the first length of conductive wire and at least one of the first and the second output conductive traces.

6. The electrical filtering device of claim 5 wherein the first length of conductive wire includes a material that is superconducting below a critical temperature.

7. The electrical filtering device of claim 5 wherein at least one of the first input conductive trace, the first output conductive trace, the second input conductive trace, the second output conductive trace, the first signal conductive trace, and the first ground conductive trace includes a material that is superconducting below a critical temperature.

8. The electrical filter device of claim 4, further comprising:

an epoxy mixture that includes an epoxy and a metal powder that is substantially non-superconducting and substantially non-magnetic, wherein at least a portion of the inner volume of the first enclosure is filled with the epoxy mixture such that at least a portion of the dielectric substrate and at least a portion of the first inductor are embedded in the epoxy mixture.

9. The electrical filter device of claim 4 wherein the dielectric substrate further has a second wide region between the first wide region and the output end, the second wide region having a through-hole, and a second narrow region between the first and the second wide regions, the electrical filter device further comprising:

a second signal conductive trace carried by the signal surface of the second wide region of the dielectric substrate;

a second ground conductive trace carried by the ground surface of the second wide region of the dielectric substrate, such that the second signal conductive trace and the second ground conductive trace are electrically insulated from one another;

a second length of conductive wire, wherein at least a portion of the second length of conductive wire is wound about the second narrow region of the dielectric substrate to form a second inductor; and a second capacitor.

10. The electrical filter device of claim 9 wherein the second capacitor is positioned in the through-hole of the second wide region, and further comprising:

at least one electrical connection between a first end of the second capacitor and the second signal conductive trace; and at least one electrical connection between a second end of the second capacitor and the second ground conductive trace, to provide a capacitive coupling between the second signal conductive trace and the second ground conductive trace.

11. The electrical filter device of claim 10, further comprising:

at least one electrical connection between the second length of conductive wire and the first length of conductive wire; and at least one electrical connection between the second length of conductive wire and the second signal conductive trace.

12. The electrical filter device of claim 11 wherein the first enclosure includes a second hole that connects the inner volume of the first enclosure to the exterior thereof, and wherein the dielectric substrate is positioned inside the first enclosure such that the second wide region aligns with the second hole in the first enclosure, and further comprising:

a piece of solder that seals the second hole in the first enclosure and that provides an electrical connection between the second ground conductive trace and the first enclosure.

13. The electrical filter device of claim 12, further comprising:

at least one electrical connection between the second length of conductive wire and at least one of the first and the second output conductive traces.

14. The electrical filtering device of claim 13 wherein one or more of the first length of conductive wire or the second length of conductive wire includes a material that is superconducting below a critical temperature.

15. The electrical filtering device of claim 13 wherein at least one of the conductive traces includes a material that is superconducting below a critical temperature.

16. The electrical filter device of claim 12 wherein the dielectric substrate further has a plurality of additional wide regions, each having a respective through-hole and a plurality of additional narrow regions, the additional wide regions and the additional narrow regions alternatively positioned along a longitudinal length of the dielectric substrate between the input end and the output end, the electrical filter device further comprising:

a plurality of additional signal conductive traces carried at respective ones of the additional wide regions by the signal surface of the dielectric substrate;

a plurality of additional ground conductive traces carried at respective ones of the additional wide regions of the ground surface of the dielectric substrate, such that each of the additional signal conductive traces is electrically insulated from a respective one of the additional ground conductive traces;

a plurality of additional lengths of conductive wire, wherein at least a portion of each of the additional lengths of conductive wire in the plurality of additional lengths of conductive wire is wound about a respective one of the additional narrow regions of the dielectric substrate to form a respective additional inductor; and a plurality of additional capacitors.

17. The electrical filter device of claim 16 wherein each of the additional capacitors is positioned in the through-hole of a respective one of the additional wide regions, and further comprising:

a first plurality of electrical connections, a respective one of the electrical connections between a first end of each of the additional capacitors and a respective one of the additional signal conductive traces;

a second plurality of electrical connections, a respective one of the electrical connections between a second end of each additional capacitor and a respective one of the additional ground conductive traces, to provide a capacitive coupling between each of the additional signal conductive trace and a respective one of the additional ground conductive traces.

18. The electrical filter device of claim 17 wherein each of the additional lengths of conductive wire is electrically connected in series with one another and at least one of the additional lengths of conductive wire is electrically connected in series with the second length of conductive wire, and further comprising:

a respective electrical connection between each of the additional lengths of conductive wire and a respective one of the additional signal conductive traces.

19. The electrical filter device of claim 18 wherein the first length of conductive wire, the second length of conductive wire, and each of the additional lengths of conductive wire form respective lengths of one continuous conductive wire.

20. The electrical filter device of claim 18 wherein the first enclosure includes a plurality of additional holes that connect the inner volume of the first enclosure to the exterior thereof and wherein the dielectric substrate is positioned inside the first enclosure such that each of the additional wide regions aligns with a respective one of the additional holes in the first enclosure, and further comprising:

a plurality of additional pieces of solder that seals a respective one of the additional holes in the first enclosure and that provides an electrical connection between respective ones of each of the additional ground conductive traces and the first enclosure.

21. The electrical filter device of claim 20, further comprising:

an electrical connection between at least one of the additional lengths of conductive wire and at least one of the first and the second output conductive traces.

22. The electrical filtering device of claim 21 wherein one or more of the first length of conductive wire, the second length of conductive wire, or the additional lengths of conductive wire includes a material that is superconducting below a critical temperature.

23. The electrical filtering device of claim 21 wherein at least one of the first input conductive trace, the first output conductive trace, the second input conductive trace, the second output conductive trace, the first signal conductive trace, and the first ground conductive trace includes a material that is superconducting below a critical temperature.

24. The electrical filtering device of claim 1 wherein the first length of conductive wire includes a material that is superconducting below a critical temperature.

25. The electrical filtering device of claim 1 wherein at least one of the first input conductive trace, the first output conductive trace, the second input conductive trace, the second output conductive trace, the first signal conductive trace, and the first ground conductive trace includes a material that is superconducting below a critical temperature.

26. The electrical filter device of claim 1, further comprising:

an epoxy mixture comprising an epoxy and a metal powder, wherein the inner volume of the first enclosure is at least partially filled with the epoxy mixture such that at least a portion of the first length of conductive wire is embedded in the epoxy mixture.

27. The electrical filtering device of claim 1, further comprising:

a high frequency dissipation filter electrically coupled in series to at least one of the first and the second output conductive traces.

28. The electrical filtering device of claim 27 wherein the high frequency dissipation filter includes a metal powder filter comprising:

a second length of conductive wire including an input section, an output section, and a wound intermediate section positioned between the input and the output sections; and an epoxy mixture comprising an epoxy and a metal powder that is substantially non-superconducting and substantially non-magnetic, wherein the metal powder filter is enclosed within the first enclosure and the intermediate section of the second length of conductive wire is embedded in the epoxy mixture.

29. The electrical filter device of claim 28 wherein the first enclosure is tubular.

30. The electrical filter device of claim 29 wherein the first enclosure is cylindrical.

31. The electrical filter device of claim 28 wherein at least a portion of the dielectric substrate extends longitudinally through at least a portion of the wound intermediate section of the second length of conductive wire such that at least a portion of the second length of conductive wire is wound about at least a portion of the dielectric substrate.

32. The electrical filter device of claim 28 wherein a ratio of the epoxy mixture is selected from the group consisting of: approximately two to one by weight of metal powder to epoxy, approximately four to one by weight of metal powder to epoxy, and approximately eight to one by weight of metal powder to epoxy.

33. The electrical filter device of claim 28 wherein the second length of conductive wire includes a material that is superconducting below a critical temperature.

* * * * *